(12) United States Patent
Leng et al.

(10) Patent No.: US 8,116,043 B2
(45) Date of Patent: Feb. 14, 2012

(54) METHOD AND SYSTEM FOR PROVIDING A MAGNETIC TRANSDUCER HAVING AN IMPROVED READ SENSOR SYNTHETIC ANTIFERROMAGNET

(75) Inventors: Qunwen Leng, Palo Alto, CA (US); Jian X. Shen, Pleasanton, CA (US); Feng Liu, San Ramon, CA (US); Geoffrey W. Anderson, Dublin, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 240 days.

(21) Appl. No.: 12/634,589

(22) Filed: Dec. 9, 2009

(65) Prior Publication Data
US 2011/0135961 A1    Jun. 9, 2011

(51) Int. Cl.
*G11B 5/39* (2006.01)
(52) U.S. Cl. .............................. 360/324.11; 360/324.2
(58) Field of Classification Search ............... 360/324.1, 360/324.11, 324.12, 324.2
See application file for complete search history.

(56) References Cited

U.S. PATENT DOCUMENTS

| | | | |
|---|---|---|---|
| 6,744,086 B2 | 6/2004 | Daughton et al. | |
| 6,801,412 B2 | 10/2004 | Gill | |
| 2007/0047159 A1 | 3/2007 | Zhao et al. | |
| 2007/0243639 A1* | 10/2007 | Pietambaram et al. | 438/3 |
| 2009/0046397 A1* | 2/2009 | Sun et al. | 360/324.11 |
| 2009/0121266 A1* | 5/2009 | Pietambaram et al. | 257/295 |
| 2009/0219754 A1* | 9/2009 | Fukumoto | 365/158 |
| 2011/0006385 A1* | 1/2011 | Zheng et al. | 257/421 |

* cited by examiner

*Primary Examiner* — Jefferson Evans

(57) ABSTRACT

A method and system for providing a magnetic structure in magnetic transducer is described. The method and system include providing a pinning layer, a synthetic antiferromagnetic (SAF) adjacent to the pinning layer, a nonmagnetic layer, and a sensor layer. The SAF resides between the nonmagnetic and pinning layers. The nonmagnetic layer is between the SAF and the sensor layer. The SAF includes a pinned layer, a reference layer, and a nonmagnetic spacer layer between the pinned and reference layers. The pinned layer is magnetically coupled with the reference layer and includes sublayers. A first sublayer has a first blocking temperature distribution ($T_{BD}$) and a first exchange energy. A second sublayer has a second $T_{BD}$ and a second exchange energy. The first sublayer is between the pinning layer and second sublayer. The first $T_{BD}$ is greater than the second $T_{BD}$. The first exchange energy is less than the second exchange energy.

35 Claims, 5 Drawing Sheets

METHOD AND SYSTEM FOR PROVIDING A MAGNETIC TRANSDUCER HAVING AN IMPROVED READ SENSOR SYNTHETIC ANTIFERROMAGNET

BACKGROUND

FIG. 1 depicts a portion of a conventional magnetic transducer 10, such as a conventional read transducer or other device. The conventional transducer 10 resides on a conventional substrate 11, such as an AlTiC substrate. The conventional transducer 10 includes a conventional bottom shield 12, conventional sensor 20, and conventional top shield 40. The transducer 10 also typically includes seed layer(s) (not shown) between the conventional AFM layer 22 and the conventional shield 12. The conventional shields 12 and 40 typically include NiFe and are formed by plating. The sensor 20 is shown in a current-perpendicular to plane (CPP) configuration. In a CPP configuration, read current is driven generally perpendicular to the plane of the layers of the device, along the z-axis shown.

The conventional sensor 20 includes a conventional antiferromagnetic (AFM) layer 22, a conventional synthetic antiferromagnet (SAF) 24, a conventional barrier layer 32, a conventional free layer 34, and may include a conventional capping layer 36. The conventional free layer 34 has a magnetization that is substantially free to change direction in response to an applied magnetic field, for example from a bit being read. The conventional barrier layer 32 may allow conduction through the sensor 20 via tunneling. The sensor 20 is thus a tunneling magnetoresistive (TMR) sensor. Note that if a conductive spacer layer is used instead of the barrier layer 32, then the sensor 20 is a spin valve. The conventional SAF layer 24 typically includes two ferromagnetic layers 26 and 30 separated by a nonmagnetic spacer layer 28. The ferromagnetic layers are generally antiferromagnetically coupled. The magnetization(s) of the conventional SAF layer 24 are pinned by the conventional AFM layer 22. More specifically, the first ferromagnetic layer 26, typically termed the pinned layer, has its magnetization pinned by the conventional AFM layer 22, for example via exchange interaction. The remaining ferromagnetic layer, or reference layer 30, has its magnetization pinned because it is strongly magnetically coupled with the pinned layer 26. The conventional pinned layer 26 is typically a single layer, for example composed of $Co_{90}Fe_{10}$. Other conventional pinned layers 26 may be composed of $Co_{75}Fe_{25}$.

Although the conventional sensor 20 functions, the conventional transducer 10 may have limited utility. For example, baseline popping (BLP) and/or baseline line noise (BLN) may occur in the conventional read sensor 20 when used in a CPP configuration. BLP refers to time domain random noise spikes above the noise baseline. BLN refers to high overall noise baseline. Both BLP and BLN are of large frequency bandwidth, generally ranging from KHz to GHz. The presence of the BLP and BLN adversely affect the signal to noise ratio, and thus performance, of the conventional transducer 10. BLP and BLN may also be significant failure modes in hard disk drive applications of the conventional sensor 20. Because they may be failure modes, BLN and BLP may also adversely affect reliability of the conventional sensor 20. Thus, use of the conventional transducer 10 may have drawbacks.

Accordingly, what is needed is a system and method for providing a transducer having improved performance.

BRIEF SUMMARY OF THE INVENTION

A method and system for providing a magnetic structure in magnetic transducer is described. The method and system include providing a pinning layer, a synthetic antiferromagnetic (SAF) adjacent to the pinning layer, a nonmagnetic layer, and a sensor layer. The SAF resides between the nonmagnetic layer and the pinning layer. The nonmagnetic layer is between the SAF and the sensor layer. The SAF includes a pinned layer, a reference layer, and a nonmagnetic spacer layer between the pinned layer and the reference layer. The pinned layer is magnetically coupled with the reference layer and includes a plurality of sublayers. A first sublayer of the plurality of sublayers has a first blocking temperature distribution ($T_{BD}$) and a first exchange energy. A second sublayer of the plurality of sublayers has a second $T_{BD}$ and a second exchange energy. The first sublayer is between the pinning layer and the second sublayer. The first $T_{BD}$ is greater than the second $T_{BD}$, while the first exchange energy is less than the second exchange energy.

DETAILED DESCRIPTION OF THE PREFERRED EMBODIMENTS

Figure 1:
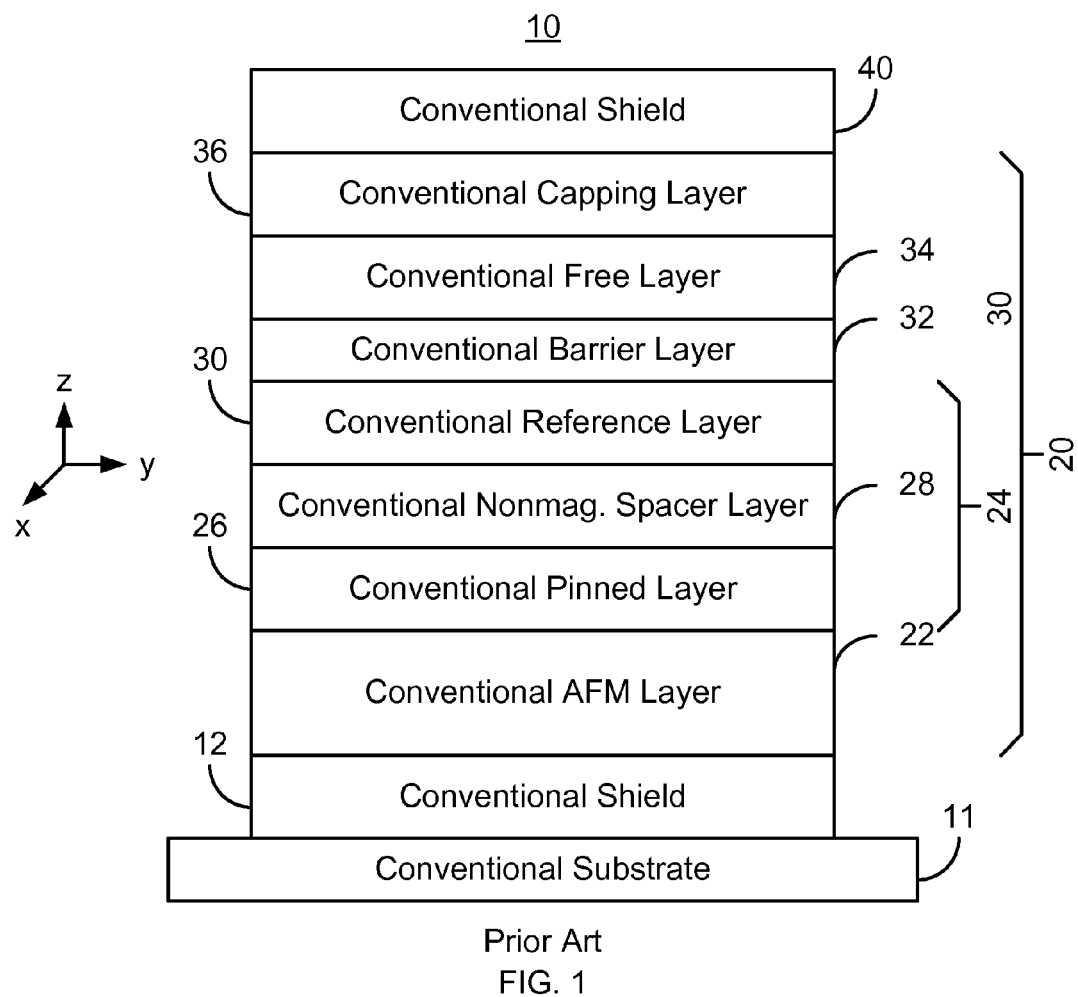
FIG. 1 is a diagram of a portion of a conventional transducer including a conventional sensor.
Figure 2:
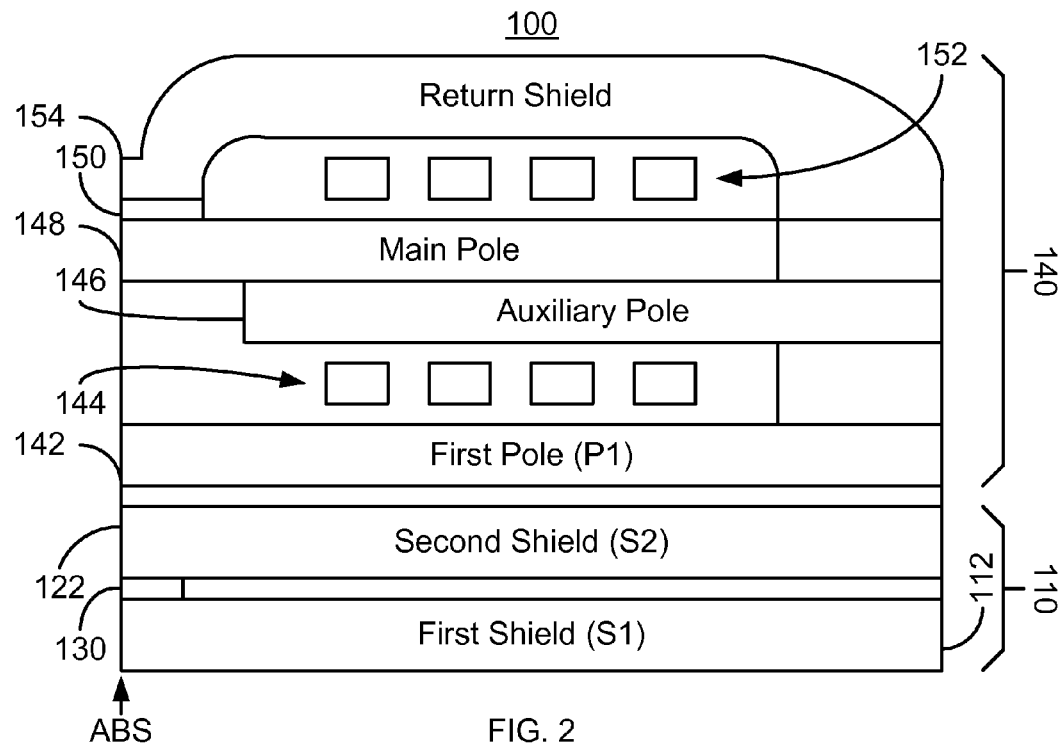
FIG. 2 depicts an exemplary embodiment of a head having a transducer including an exemplary embodiment of a magnetic structure.
Figure 3:
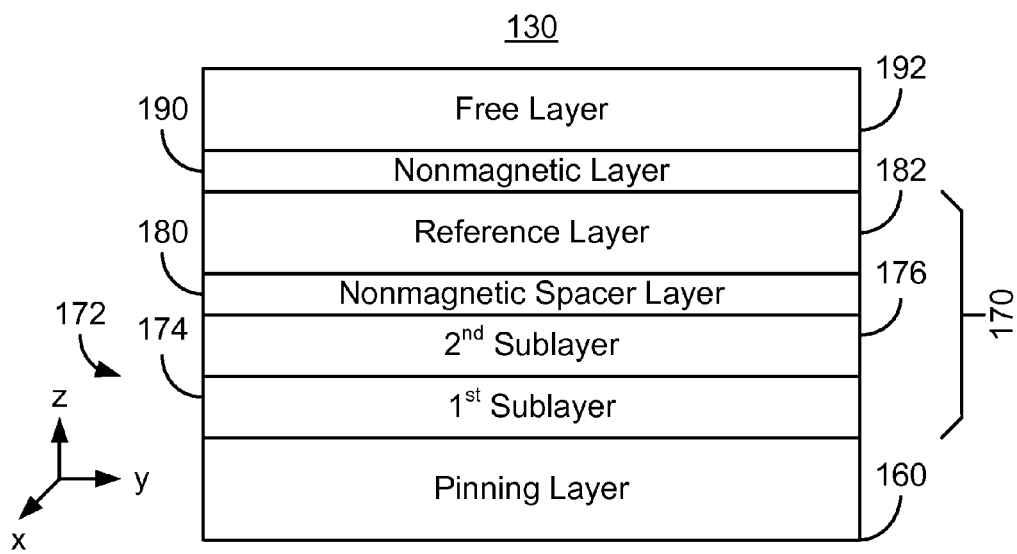
FIG. 3 depicts an exemplary embodiment of a portion of transducer including an exemplary embodiment of a magnetic structure.

FIG. 2 depicts a magnetic head 100. The magnetic head includes a magnetic read transducer 110 and write transducer 140. FIG. 3 depicts an exemplary embodiment of a magnetic structure 130 that may be used as the read sensor of the magnetic head 100. However, in other embodiments, the magnetic structure 130 may be used for other purposes. Further, the magnetic structure 130 is shown in a CPP configuration, and thus is attached to the shields 112 and 122. However, in another embodiment, a gap may exist between the magnetic structure 130 and the shields 112 and/or 122. Referring to FIGS. 2-3, in another embodiment, the head 100 might include only the read transducer 110. The head 100 may reside on a slider (not shown) of a disk drive (not shown). The head 100 is also described in the context of particular layers. However, in some embodiments, such layers may include sub-layer(s). For clarity, FIGS. 2-3 are not drawn to scale.

The write transducer 140 includes a first pole 142, auxiliary pole 146, main pole 148, write gap 150, coils 144 and 152, and return shield 154. However, in another embodiment, the write transducer 140 other and/or different components. In addition, one or more portions of the write transducer 140 might be omitted in various embodiments.

The read transducer 110 includes shields 112 and 122 and read sensor/magnetic structure 130. In addition, although only one magnetic structure 130 is shown, multiple magnetic structures may be present. In addition, although used as a read sensor in the transducer 100, the magnetic structure 130 might be used for other purposes in another transducer. In addition, as shown expressly in FIG. 3, the magnetic structure 130 includes a pinning layer 160, a SAF 170, a nonmagnetic layer 190, and a free layer 192. In some embodiments, other components may be included as part of the magnetic structure 130. For example, the magnetic structure 130 might also include seed layer(s) and/or capping layers.

The free layer 192 includes one or more ferromagnetic layers (not separately shown in FIG. 3). At least some of these ferromagnetic layers may be spaced by nonmagnetic layers. In the embodiment shown in FIG. 3, the free layer 192 is a sensor layer for the head 100. Consequently, the free layer 192 is referred to hereinafter as a sensor layer 192. The nonmagnetic layer 190 separates the sensor layer 192 from the SAF 170. In some embodiments, the nonmagnetic layer 190 is an insulating, tunneling barrier layer. For example, the nonmagnetic layer 190 may be a crystalline tunneling barrier layer. In some such embodiments, the crystalline tunneling barrier may include or be composed of crystalline MgO. In other embodiments, the nonmagnetic layer 190 may be conductive and/or have another structure. The pinning layer 160 pins the magnetization of the SAF 170. The pinning layer may be an AFM layer, such as IrMn, that pins the magnetization of the pinned layer 172 through an exchange interaction. However, in other embodiment, the pinning layer 160 may be another material and/or have other properties.

The SAF 170 is adjacent to the pinning layer 160. The SAF 170 includes a pinned layer 172 that adjoins the pinning layer 160, a reference layer 182, and a nonmagnetic spacer layer 180 between the pinned layer and the reference layer. The pinned layer 172 is magnetically coupled with the reference layer 182. In some embodiments, the magnetizations of the pinned and reference layers are antiferromagnetically coupled. Although shown as a single ferromagnetic layer, the reference layer 182 may include multiple sublayers. The nonmagnetic spacer layer 182 is also desired to be conducting. For example, materials such as Ru may be used for the nonmagnetic spacer layer 180.

The pinned layer 172 includes sublayers. In the embodiment shown in FIG. 3, there are two sublayers 174 and 176. However, in other embodiments, additional sublayers (not shown in FIG. 3) may be provided. The first sublayer 174 has a first blocking temperature distribution ($T_{BD}$) and a first exchange energy. The second sublayer 176 has a second $T_{BD}$ and a second exchange energy. The $T_{BD}$ of a layer is a measure of how disordered the magnetic layer is at elevated temperatures. More specifically, the $T_{BD}$ thus corresponds to the temperature at which a specified fraction of the magnetic layer is no longer pinned by the pinning layer 160. For example, in some embodiments, the $T_{BD}$ is the temperature at which at least ten percent of a magnetic layer is not pinned by the pinning layer 160. Generally, higher $T_{BD}$s are desirable. The exchange energy is a measure of the pinning strength of due to an interaction between a particular magnetic layer and an ARM layer. The sublayers 174 and 176 are configured such that the first $T_{BD}$ of the first sublayer 174 is greater than the second $T_{BD}$ of the second sublayer 176. In some embodiments, the sublayers 174 and 176 are also configured such that both the first and the second $T_{BD}$ are greater than or equal to 270 degrees Celsius. Conversely, the first exchange energy of the first sublayer 174 is less than the second exchange energy of the second sublayer 176. The exchange energies are desired to be at least 0.3 erg/cm². In some such embodiments, the exchange energy is at least 0.4 erg/cm². For example, in some embodiments, first sublayer 174 includes $Co_{1-x}Fe_x$ and the second sublayer 176 includes $Co_{1-y}Fe_y$, where x is greater than zero and not more than 0.15 and y is not less than 0.2 and not more than 0.5. In some such embodiments, x is at least 0.05 and y is at least 0.25 and not more than 0.35. The first sublayer 174 and the second sublayer 176 may also include different constituents. For example, the first sublayer may include $Co_{1-v-w}Fe_vB_w$, where v is greater than zero, w is greater than zero and v+w is less than one. In such an embodiment, the second sublayer 176 may include the $Co_{1-y}Fe_y$ that is described above.

In addition to configuring the $T_{BD}$ and exchange energies, the thicknesses of the sublayers 174 and 176 may also be selected. In some embodiments, the first sublayer 174 has a thickness of at least three Angstroms and not more than twenty Angstroms. Similarly, the second sublayer 176 is at least three Angstroms and not more than twenty Angstroms thick. In some embodiments, the first sublayer 174 and the second sublayer have the same thickness. However, in other embodiments, their thicknesses differ. For example, the second sublayer 176 may be thicker than the first sublayer 174. In some embodiments, for example, the first sublayer 174 may have a thickness of at least three and not more than seven Angstroms, while the second sublayer 176 has a thickness of at least eight and not more than twelve Angstroms.

In addition to the properties described above, it is desirable for the pinned layer 172 to have a low dispersion. The dispersion is a measure of the spread of the magnetic moments of grains in a magnetic layer around the magnetization direction of the layer. A lower dispersion indicates that the magnetic moments in the layer are more closely aligned with the net magnetization of the layer. Thus, in addition to the $T_{BD}$ and exchange energy described above, the sublayers 174 and 176 are desired to provide the pinned layer 172 with as low a dispersion as possible.

Use of the magnetic structure 130 including the pinned layer 172 of the SAF 170 may improve the performance of the transducer 110. Because each of the sublayers 174 and 176 are selected to have the above-described $T_{BD}$ and exchange energy, the pinned layer 172 may have a desired combination of higher exchange energy and higher $T_{BD}$. Further, the sublayers 174 and 176 may be configured such that the pinned layer 172 has a lower dispersion than might otherwise be available. As a result, the pinning layer 160 may be better able to pin the magnetization of the pinned layer 172. The magnetization of the pinned layer 172 may thus be made more stable. The reference layer 182 is magnetically coupled with the pinned layer 172. As a result, the magnetization of the reference layer 182 may also be more stable. It has been determined that the BLP and BLN described above may be due at least in part to magnetic instabilities in the SAF 170. Improved pinning of the pinned layer 172 and thus of the reference layer 182 may reduce magnetic fluctuations in the SAF 170. This improvement in stability of the SAF 170 may reduce the BLP and BLN. The improved stability may also result in greater robustness of the magnetic structure 170 against stresses in fabrication or use in a drive. In addition, when used in the head 100, the magnetic structure 130 may result in improved roll-off fields. Consequently, performance, reliability, and yield for the magnetic structure 130 and head 100 may be enhanced.

Figure 4:
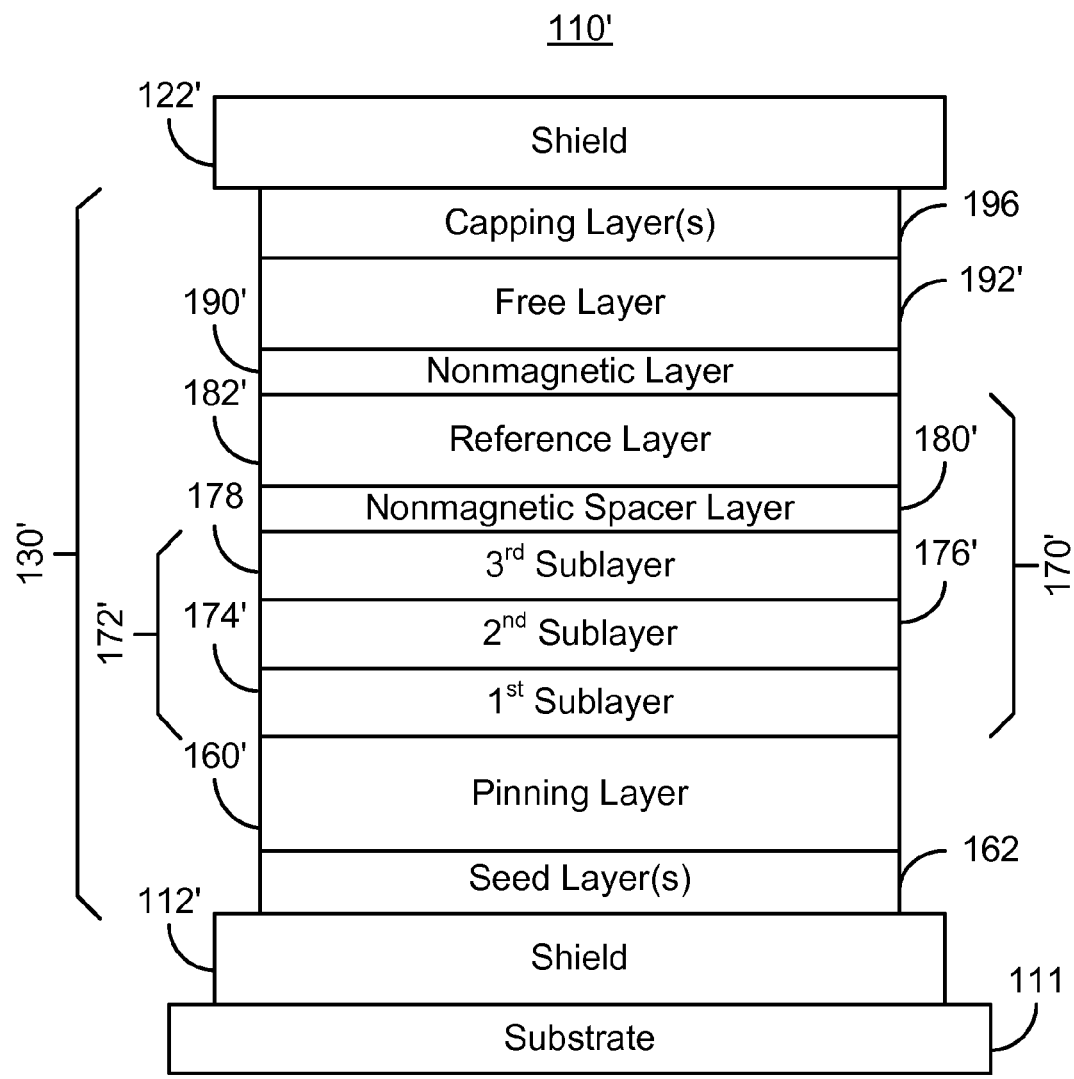
FIG. 4 depicts another exemplary embodiment of a portion of transducer including an exemplary embodiment of a magnetic structure.

FIG. 4 depicts another exemplary embodiment of a portion of transducer 110' including an exemplary embodiment of a magnetic structure 130'. Portions of the transducer 110' are analogous to those of the head 100 and structure 130 shown in FIGS. 2-3. Such analogous structures are labeled similarly. The magnetic structure 130' thus includes a pinning layer 160', a SAF 170', a nonmagnetic layer 190', and a sensor layer 192' that are analogous to the pinning layer 160, the SAF 170, the nonmagnetic layer 190, and the sensor layer 192, respectively. In the embodiment shown, other components may be included as part of the magnetic structure 130'. For example, the magnetic structure 130' also includes seed layer(s) 162 and capping layer(s) 196. The magnetic structure 130' may thus be used as the read sensor of the magnetic head 100. However, in other embodiments, the magnetic structure 130' may be used for other purposes. Further, the magnetic structure 130' is shown in a CPP configuration, and thus is attached to the shields 112' and 122', residing on substrate 111. However, in another embodiment, a gap may exist between the magnetic structure 130' and the shields 112' and/or 122'. The structure 130' is also described in the context of particular layers. However, in some embodiments, such layers may include sub-layer(s). For clarity, FIG. 4 is not drawn to scale.

The SAF 170' is analogous to the SAF 170. Thus, the SAF 170' includes sublayers 174' and 176'. In the embodiment shown in FIG. 4, there is an additional sublayer 178. In other embodiments, further sublayers (not shown in FIG. 4) may be provided. The first sublayer 174' has a first $T_{BD}$ and a first exchange energy. The second sublayer 176' has a second $T_{BD}$ and a second exchange energy. The third sublayer 178 has a third $T_{BD}$ and a third exchange energy, The sublayers 174', 176', and 178 are configured such that the first $T_{BD}$ of the first sublayer 174' is greater than the second $T_{BD}$ of the second sublayer 176'. In some embodiments, the third sublayer 178 is configured such that the third $T_{BD}$ is greater than the second $T_{BD}$. In some embodiments, the sublayers 174', 176', and 178 are also configured such that the first, second, and third $T_{BD}$ are greater than or equal to 270 degrees Celsius. Conversely, the first exchange energy of the first sublayer 174' is less than the second exchange energy of the second sublayer 176'. In some embodiments, the third sublayer 178 is configured such that the third exchange energy is less than the second exchange energy. The exchange energies are desired to be at least 0.3 erg/cm². In some such embodiments, the exchange energy is at least 0.4 erg/cm². In some embodiments, the third sublayer 178 is configured to have substantially the same $T_{BD}$ and exchange energy as the first sublayer 174'. However, in other embodiments, the third sublayer 178 may have a different TBD and/or exchange energy than the first sublayer 174'.

For example, in some embodiments, the first sublayer 174' and the third sublayer 178 each includes $Co_{1-x}Fe_x$. In such embodiments, the second sublayer 176' may include $Co_{1-y}Fe_y$, where x is greater than zero and not more than 0.15 and y is not less than 0.2 and not more than 0.5. In some such embodiments, x is at least 0.05 and y is at least 0.25 and not more than 0.35. The first sublayer 174', the second sublayer 176', and third sublayer 178 may also include different constituents. For example, the first sublayer 174' may include $Co_{1-v-w}Fe_vB_w$, where v is greater than zero, w is greater than zero and v+w is less than one. In such an embodiment, the second sublayer 176 may include the $Co_{1-y}Fe_y$ and the third sublayer 178 may include $Co_{1-v-w}Fe_vB_w$ and/or $Co_{1-x}Fe_x$, as described above In addition to configuring the $T_{BD}$ and exchange energies, the thicknesses of the sublayers 174', 176', and 178 may also be selected. In some embodiments, the first sublayer 174' has a thickness of at least three Angstroms and not more than twenty Angstroms. Similarly, the second sublayer 176' may be at least three Angstroms and not more than twenty Angstroms thick. The thickness of the third layer 178 may be greater than zero Angstroms and not more than ten Angstroms. In some embodiments, the first sublayer 174', the second sublayer 176' and the third sublayer 178 have the same thickness. However, in other embodiments, their thicknesses differ. For example, the second sublayer 176' may be thicker than the first sublayer 174' and the third sublayer 178. In such embodiments, the first sublayer 174' and the third sublayer 178 may or may not have the same thickness. In some embodiments, for example, the first sublayer 174' and the third sublayer 178 may each have a thickness of at least three and not more than seven Angstroms, while the second sublayer 176' has a thickness of at least eight and not more than twelve Angstroms.

In addition to the properties described above, it is desirable for the pinned layer 172' to have a low dispersion. Thus, in addition to the $T_{BD}$ and exchange energy described above, the sublayers 174', 176', and 178 are desired to provide the pinned layer 172' with as low a dispersion as possible.

Use of the magnetic structure 130' including the pinned layer 172' of the SAF 170' may improve the performance of the transducer 110'. The transducer 110' and magnetic structure 130' may have the benefits described above with respect to the transducer 110 and the magnetic structure 130. In addition, use of the third sublayer 178 may improve the asymmetry of the magnetic structure 130'.

Figure 5:
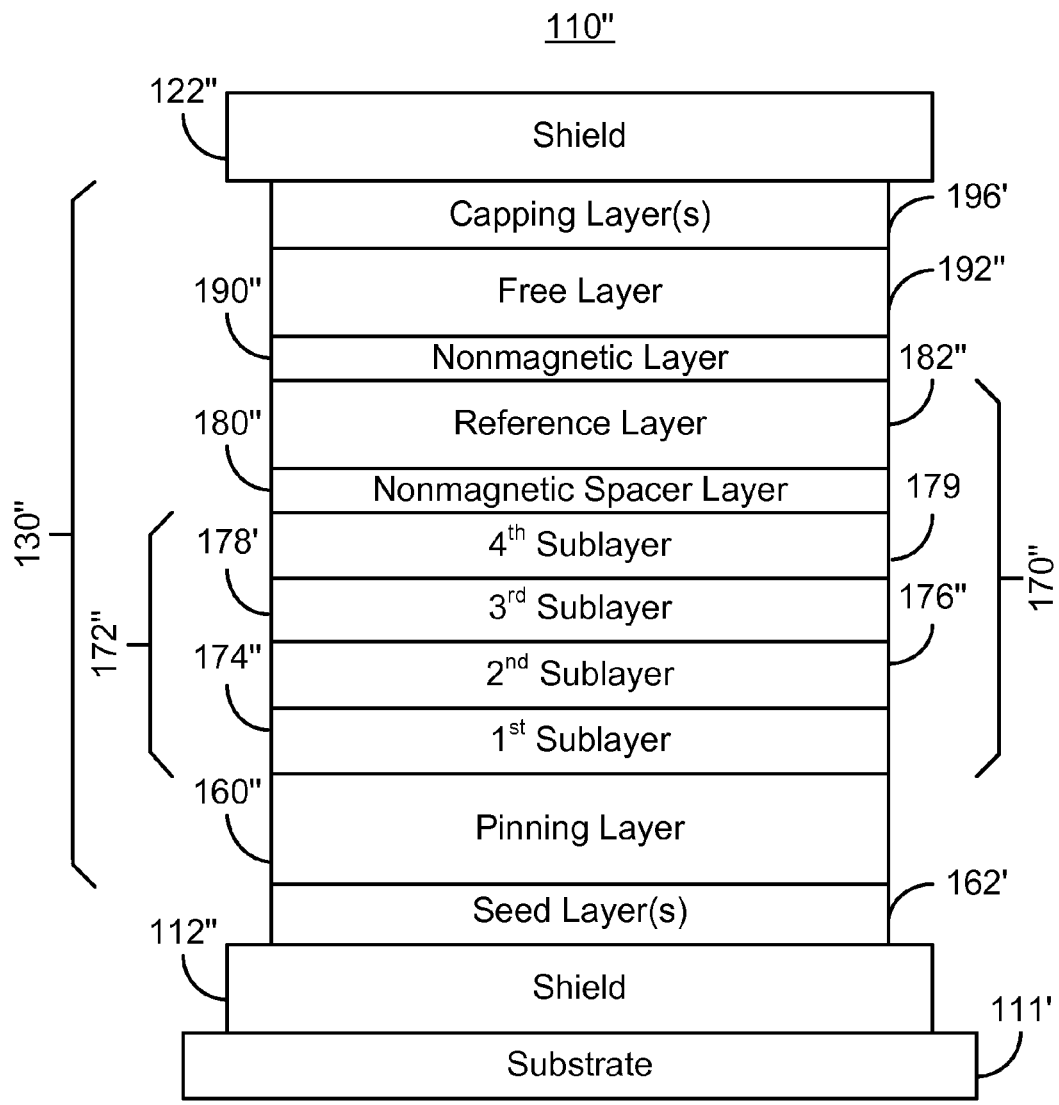
FIG. 5 depicts another exemplary embodiment of a portion of transducer including an exemplary embodiment of a magnetic structure.

FIG. 5 depicts another exemplary embodiment of a portion of transducer 110" including an exemplary embodiment of a magnetic structure 130". Portions of the transducer 110" are analogous to those of the head 100, transducer 110/110', and structure 130'130' shown in FIGS. 2-4. Such analogous structures are labeled similarly. The magnetic structure 130" thus includes a pinning layer 160", a SAF 170", a nonmagnetic layer 190", and a sensor layer 192" that are analogous to the pinning layer 160/160', the SAF 170/170', the nonmagnetic layer 190/190', and the sensor layer 192/192', respectively. In the embodiment shown, other components may be included as part of the magnetic structure 130". For example, the magnetic structure 130" also includes seed layer(s) 162' and capping layer(s) 196'. The magnetic structure 130" may thus be used as the read sensor of the magnetic head 100. However, in other embodiments, the magnetic structure 130" may be used for other purposes. Further, the magnetic structure 130" is shown in a CPP configuration, and thus is attached to the shields 112" and 122", residing on substrate 111'. However, in another embodiment, a gap may exist between the magnetic structure 130" and the shields 112" and/or 122". The structure 130" is also described in the context of particular layers. However, in some embodiments, such layers may include sub-layer(s). For clarity, FIG. 5 is not drawn to scale.

The SAF 170" is analogous to the SAF 170/170'. Thus, the SAF 170" includes sublayers 174", 176", and 178'. The relationships between the $T_{BD}$ and exchange energies of the sublayers 174", 176", and 178' may be the same as the relationships between the $T_{BD}$ and exchange energies of the sublayers 174/174', 176/176', and 178. In addition, the SAF 170" includes a fourth sublayer 179. The fourth sublayer 179 includes a fourth $T_{BD}$ and a fourth exchange energy. In some embodiments, the fourth $T_{BD}$ is less than the first $T_{BD}$ and third $T_{BD}$. The fourth exchange energy is greater than the first and third exchange energies. Thus, the fourth layer 179 may be analogous to the second sublayer 176". The pinned layer 172" may thus be considered to include two bilayers. The first bilayer includes the first sublayer 174" and the second sublayer 176". The second bilayer includes the third sublayer 178' and the fourth sublayer 179. The sublayers 174", 176", and 178' have analogous compositions to the sublayers 174/174', 176/176', and 178. In addition, the fourth sublayer 179 may include $Co_{1-u}Fe_u$, where u is not less than 0.2 and not more than 0.5. In some such embodiments, u is at least 0.25 and not more than 0.35.

In addition to configuring the $T_{BD}$, the exchange energies, and the compositions, the thicknesses of the sublayers 174", 176", 178', and 179 may also be selected. The sublayers 174", 176", and 178' have thicknesses analogous to the thicknesses 174/174', 176/176', and 178. In addition to the properties described above, it is desirable for the pinned layer 172" to have a low dispersion. Thus, in addition to the $T_{BD}$ and exchange energy described above, the sublayers 174", 176", 178', and 179 are desired to provide the pinned layer 172" with as low a dispersion as possible.

Use of the magnetic structure 130" including the pinned layer 172" of the SAF 170" may improve the performance of the transducer 110". The transducer 110" and magnetic structure 130" may have the benefits described above with respect to the transducer 110/110' and the magnetic structure 130/130'.

Figure 6:
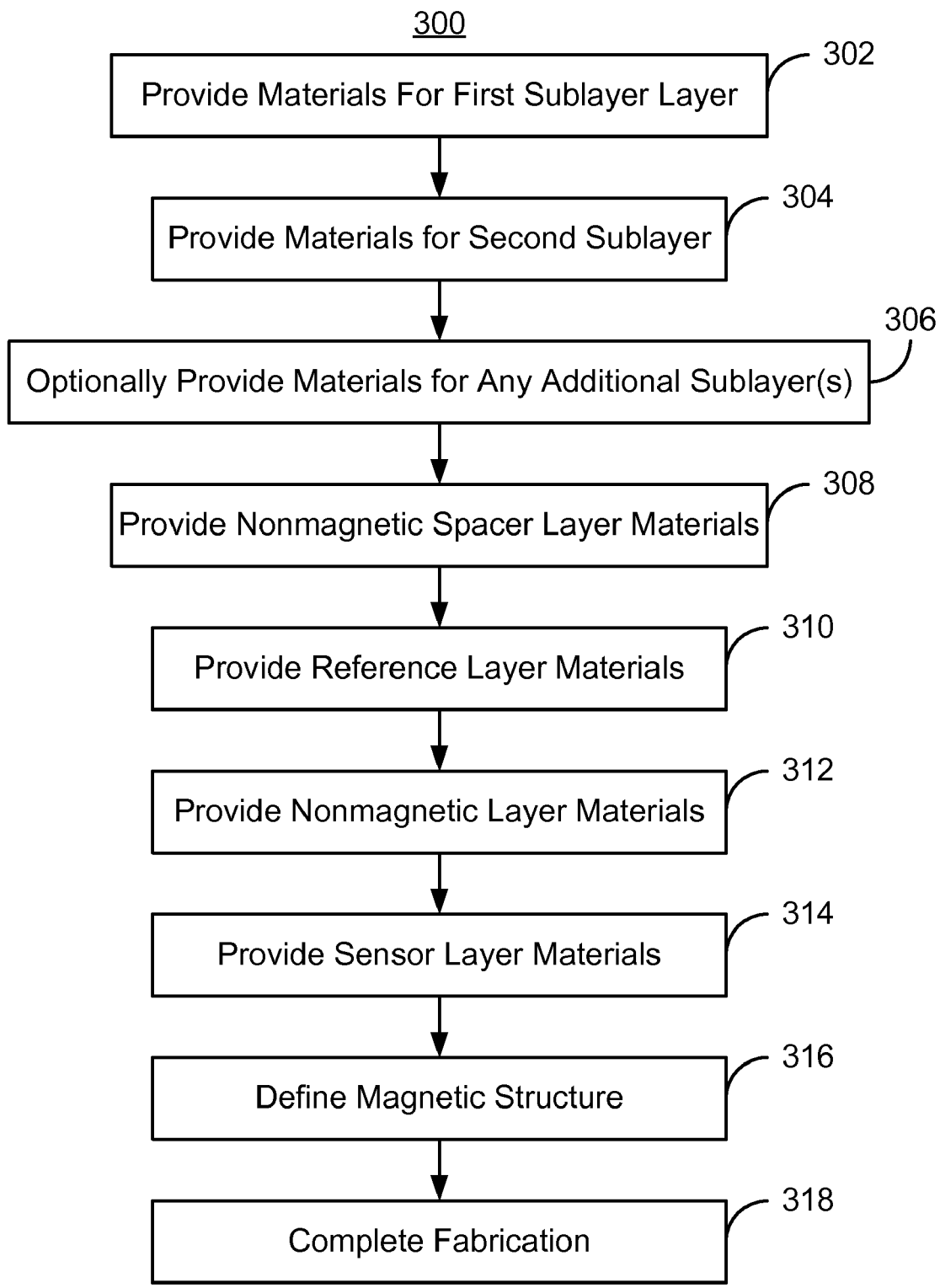
FIG. 6 depicts an exemplary embodiment of a method of forming a portion of transducer including an exemplary embodiment of a magnetic structure.

FIG. 6 depicts an exemplary embodiment of a method 300 for forming a portion of transducer including an exemplary embodiment of a magnetic structure. For simplicity, some steps may be omitted and/or combined. The method 300 is described in the context of the transducers 110/110'/110". However, the method 300 may be used for other transducers. The method 300 also may commence after formation of other structures of the read and/or write transducer. The method 300 is also described in the context of providing a single magnetic structure 130/130'/130". However, the method 300 may be used to fabricate multiple structures at substantially the same time. The method 300 and structures such as the transducer 110/110'/110" are also described in the context of particular layers. However, in some embodiments, such layers may include sub-layer(s). The method 300 commences after the pinning layer 160/160'/160" is provided.

The material(s) for first sublayer 174/174'/174" are provided on the pinning layer 160/160'/160", via step 302. The material(s) for second sublayer 176/176'/176" are deposited on the first pinned layer 174/174'/174", via step 304. Material(s) for any additional sublayers, such as the sublayers 178/178' and 179, are provided, via step 306. Thus, materials for the pinned layer 172/172'/172" are provided in steps 302, 304, and 306. The nonmagnetic spacer layer 180/180'/180" material(s) are provided, via step 308. The reference layer 182/182'/182" material(s) are provided, via step 310. Thus, the materials for the SAF 170/170'/170" are provided in steps 302, 304, 306, 308, and 310. The material(s) for the nonmagnetic layer 190/190'/190" are provided, via step 312. Materials for the sensor layer 192/192'/192" are deposited, via step 314. In addition, capping layer material(s) may also be provided.

Thus, through steps 302 through 314 provides the stack for the magnetic structure 130/130'/130". The magnetic structure 130 is defined, via step 316. Step 316 may include providing a mask and milling exposed portions of the stack. Fabrication of the transducer 110/110'/110" may be completed, via step 318. Thus, using the method 300, the benefits of the transducers 110, 110', and 110" may be achieved.

We claim:

1. A magnetoresistive structure configured for use in a magnetic transducer comprising:
   a pinning layer;
   a synthetic antiferromagnetic (SAF) adjacent to the pinning layer, the SAF including a pinned layer, a reference layer, and a nonmagnetic spacer layer between the pinned layer and the reference layer, the pinned layer being magnetically coupled with the reference layer and including a plurality of sublayers, a first sublayer of the plurality of sublayers having a first blocking temperature distribution ($T_{BD}$) and a first exchange energy, a second sublayer of the plurality of sublayers having a second $T_{BD}$ and a second exchange energy, the first sublayer residing between the pinning layer and the second sublayer, the first $T_{BD}$ being greater than the second $T_{BD}$, the first exchange energy being less than the second exchange energy;
   a nonmagnetic layer, the SAF residing between the nonmagnetic layer and the pinning layer; and
   a sensor layer, the nonmagnetic layer residing between the SAF and the sensor layer.

2. The magnetoresistive structure of claim 1 wherein the nonmagnetic layer includes an insulating tunneling barrier layer.

3. The magnetoresistive structure of claim 1 wherein the first sublayer includes $Co_{1-x}Fe_x$ and the second sublayer includes $Co_{1-y}Fe_y$, where x is greater than zero and not more than 0.15 and y is not less than 0.2 and not more than 0.5.

4. The magnetoresistive structure of claim 3 wherein x is at least 0.05 and y is at least 0.25 and not more than 0.35.

5. The magnetoresistive structure of claim 3 wherein the first sublayer has a first thickness and the second sublayer has a second thickness, the first thickness being at least three Angstroms and not more than twenty Angstroms, the second thickness being at least three Angstroms and not more than twenty Angstroms.

6. The magnetoresistive structure of claim 5 wherein the second thickness is greater than the first thickness.

7. The magnetoresistive structure of claim 1 wherein the plurality of sublayers further includes a third sublayer, the third sublayer having a third $T_{BD}$ and a third exchange energy.

8. The magnetoresistive structure of claim 7 wherein the third $T_{BD}$ is greater than the second $T_{BD}$ and the third exchange energy is less than the second exchange energy.

9. The magnetoresistive structure of claim 8 wherein the third exchange energy is substantially the same as the first exchange energy and the third $T_{BD}$ is substantially the same as the first $T_{BD}$.

10. The magnetoresistive structure of claim 8 wherein the first sublayer includes $Co_{1-x}Fe_x$, the second sublayer includes $Co_{1-y}Fe_y$, and the third sublayer includes $Co_{1-x}Fe_x$, where x is greater than zero and not more than 0.15 and y is not less than 0.2 and not more than 0.5.

11. The magnetoresistive structure of claim 10 wherein x is at least 0.05 and y is at least 0.25 and not more than 0.35.

12. The magnetoresistive structure of claim 10 wherein the first sublayer has a first thickness, the second sublayer has a second thickness, and the third sublayer has a third thickness, the first thickness being at least three Angstroms and not more than twenty Angstroms, the second thickness being at least three Angstroms and not more than twenty Angstroms, and the third thickness being greater than zero Angstroms and not more than ten Angstroms.

13. The magnetoresistive structure of claim 12 wherein the second thickness is greater than the first thickness and greater than the third thickness.

14. The magnetoresistive structure of claim 8 wherein the plurality of sublayers further includes a fourth sublayer, the fourth sublayer having a fourth $T_{BD}$ and a fourth exchange energy.

15. The magnetoresistive structure of claim 1 wherein the pinned layer includes at least one of $Co_{1-x}Fe_x$ and $Co_{1-y-z}Fe_yB_z$, where x is greater than zero and less than one, y is greater than zero, z is greater than zero and y+z is less than one.

16. The magnetoresistive structure of claim 15 wherein the first sublayer includes the $Co_{1-y-z}Fe_yB_z$.

17. The magnetoresistive structure of claim 1 wherein the pinning layer includes an antiferromagnetic layer.

18. A magnetic head comprising:
a read transducer including a read sensor, the read sensor further including a pinning layer, a synthetic antiferromagnetic (SAF) adjacent to the pinning layer, a nonmagnetic layer, and a sensor layer, the SAF residing between the nonmagnetic layer and the pinning layer, the nonmagnetic layer residing between the SAF and the sensor layer, the SAF including a pinned layer, a nonmagnetic spacer layer, and a reference layer, the pinned layer being magnetically coupled with the reference layer and including a plurality of sublayers, a first sublayer of the plurality of sublayers having a first blocking temperature distribution ($T_{BD}$) and a first exchange energy, a second sublayer of the plurality of sublayers having a second $T_{BD}$ and a second exchange energy, the first sublayer residing between the pinning layer and the second sublayer, the first $T_{BD}$ being greater than the second $T_{BD}$, the first exchange energy being less than the second exchange energy.

19. The magnetic head of claim 18 wherein the first sublayer includes $Co_{1-x}Fe_x$ and the second sublayer includes $Co_{1-y}Fe_y$, where x is greater than zero and not more than 0.15 and y is not less than 0.2 and not more than 0.5.

20. The magnetic head of claim 18 wherein x is at least 0.05 and y is at least 0.25 and not more than 0.35.

21. The magnetic head of claim 18 wherein the first sublayer has a first thickness and the second sublayer has a second thickness, the first thickness being at least three Angstroms and not more than twenty Angstroms, the second thickness being at least three Angstroms and not more than twenty Angstroms.

22. The magnetic head of claim 18 wherein the plurality of sublayers further includes a third sublayer, the third sublayer having a third $T_{BD}$ and a third exchange energy, the third $T_{BD}$ being greater than the second $T_{BD}$, the third exchange energy being less than the second exchange energy.

23. The magnetic head of claim 22 wherein the first sublayer includes $Co_{1-x}Fe_x$, the second sublayer includes $Co_{1-y}Fe_y$, and the third sublayer includes $Co_{1-x}Fe_x$, where x is greater than zero and not more than 0.15 and y is not less than 0.2 and not more than 0.5.

24. The magnetic head of claim 23 wherein x is at least 0.05 and y is at least 0.25 and not more than 0.35.

25. The magnetic head of claim 23 wherein the first sublayer has a first thickness, the second sublayer has a second thickness, and the third sublayer has a third thickness, the first thickness being at least three Angstroms and not more than twenty Angstroms, the second thickness being at least three Angstroms and not more than twenty Angstroms, and the third thickness being greater than zero Angstroms and not more than ten Angstroms.

26. The magnetic head of claim 18 further comprising:
a write transducer.

27. A disk drive comprising:
a slider; and
the magnetic head of claim 18.

28. A method for fabricating a magnetoresistive structure for use in a magnetic transducer, the method comprising:
providing a pinning layer;
providing a synthetic antiferromagnetic (SAF) adjacent to the pinning layer, the SAF including a pinned layer, a reference layer, and a nonmagnetic spacer layer between the pinned layer and the reference layer, the pinned layer being magnetically coupled with the reference layer and including a plurality of sublayers, a first sublayer of the plurality of sublayers having a first blocking temperature distribution ($T_{BD}$) and a first exchange energy, a second sublayer of the plurality of sublayers having a second $T_{BD}$ and a second exchange energy, the first sublayer residing between the pinning layer and the second sublayer, the first $T_{BD}$ being greater than the second $T_{BD}$, the first exchange energy being less than the second exchange energy;
providing a nonmagnetic layer, the SAF residing between the nonmagnetic layer and the pinning layer;
providing a sensor layer, the nonmagnetic layer residing between the SAF and the sensor layer; and
patterning the magnetoresistive structure in the pinning layer, the SAF, the nonmagnetic layer, and the sensor layer.

29. The method of claim 28 wherein the first sublayer includes $Co_{1-x}Fe_x$ and the second sublayer includes $Co_{1-y}Fe_y$, where x is greater than zero and not more than 0.15 and y is not less than 0.2 and not more than 0.5.

30. The method of claim 29 wherein x is at least 0.05 and y is at least 0.25 and not more than 0.35.

31. The method of claim 29 wherein the first sublayer has a first thickness and the second sublayer has a second thickness, the first thickness being at least three Angstroms and not more than twenty Angstroms, the second thickness being at least three Angstroms and not more than twenty Angstroms.

32. The method of claim 28 wherein the plurality of sublayers further includes a third sublayer, the third sublayer having a third $T_{BD}$ and a third exchange energy, the third $T_{BD}$ being greater than the second $T_{BD}$, the third exchange energy being less than the second exchange energy.

33. The method of claim 32 wherein the first sublayer includes $Co_{1-x}Fe_x$, the second sublayer includes $Co_{1-y}Fe_y$, and the third sublayer includes $Co_{1-x}Fe_x$, where x is greater than zero and not more than 0.15 and y is not less than 0.2 and not more than 0.5.

34. The method of claim 33 wherein x is at least 0.05 and y is at least 0.25 and not more than 0.35.

35. The method of claim 33 wherein the first sublayer has a first thickness, the second sublayer has a second thickness, and the third sublayer has a third thickness, the first thickness being at least three Angstroms and not more than twenty Angstroms, the second thickness being at least three Angstroms and not more than twenty Angstroms, and the third thickness being greater than zero Angstroms and not more than ten Angstroms.

* * * * *